US007714661B2

(12) United States Patent
Doy et al.

(10) Patent No.: US 7,714,661 B2
(45) Date of Patent: May 11, 2010

(54) SINGLE SUPPLY DIRECT DRIVE AMPLIFIER

(75) Inventors: Tony Doy, Sunnyvale, CA (US); Ronald Koo, Mountain View, CA (US)

(73) Assignee: Maxim Integrated Products, Inc., Sunnyvale, CA (US)

( * ) Notice: Subject to any disclaimer, the term of this patent is extended or adjusted under 35 U.S.C. 154(b) by 73 days.

(21) Appl. No.: 12/116,144

(22) Filed: May 6, 2008

(65) Prior Publication Data

US 2008/0273120 A1  Nov. 6, 2008

Related U.S. Application Data

(63) Continuation of application No. 11/711,480, filed on Feb. 26, 2007, now abandoned, which is a continuation of application No. 11/039,386, filed on Jan. 18, 2005, now Pat. No. 7,183,857, and a continuation-in-part of application No. 10/056,994, filed on Jan. 24, 2002, now Pat. No. 7,061,327.

(60) Provisional application No. 60/592,868, filed on Jul. 29, 2004.

(51) Int. Cl.
   *H03F 3/04* (2006.01)
(52) U.S. Cl. ........................ 330/297; 330/296
(58) Field of Classification Search ............. 330/297, 330/296, 285, 307; 307/296.1
   See application file for complete search history.

(56) References Cited

U.S. PATENT DOCUMENTS 4,241,313 A   12/1980   Takehara .................. 330/253
4,456,887 A   6/1984    Tokumo
4,780,625 A   10/1988   Zobel
4,820,997 A   4/1989    Sano et al.
5,122,759 A   6/1992    Nodar
5,280,235 A   1/1994    Neale et al.
5,289,137 A * 2/1994    Nodar et al. ............... 330/296
5,412,309 A   5/1995    Ueunten ..................... 323/316
5,422,600 A   6/1995    Petty et al.
5,455,523 A   10/1995   Wallace et al.
5,563,526 A   10/1996   Hastings et al.

(Continued)

FOREIGN PATENT DOCUMENTS

EP        0651500         5/1995

(Continued)

OTHER PUBLICATIONS

*80mW, DirectDrive Stereo Headphone Driver with Shutdown*, Maxim Integrated Products, pp. 1-20, Oct. 2002.

(Continued)

*Primary Examiner*—Henry K Choe
(74) *Attorney, Agent, or Firm*—Haverstock & Owens LLP

(57) ABSTRACT

A driver amplifier operative from a single DC voltage supply, coupled directly to the output load without the need for DC coupling capacitors used for preventing DC reaching the output load. An onboard power supply generates a negative voltage rail that powers the output amplifiers, allowing driver amplifier operation from both positive and negative rails. Since the amplifiers can be biased at ground potential (0 volts), no significant DC voltage exists across the load and the need for DC coupling capacitors is eliminated.

14 Claims, 10 Drawing Sheets

U.S. PATENT DOCUMENTS

| | | | |
|---|---|---|---|
| 5,625,278 | A | 4/1997 | Thiel et al. |
| 5,666,355 | A | 9/1997 | Huah et al. |
| 5,760,652 | A | 6/1998 | Maemura et al. |
| 6,011,440 | A | 1/2000 | Bell et al. |
| 6,178,247 | B1 | 1/2001 | Ogita et al. |
| 6,472,935 | B2 | 10/2002 | King et al. ............. 330/51 |
| 6,489,848 | B2 | 12/2002 | Smith et al. ............. 330/261 |
| 6,512,411 | B2 | 1/2003 | Meng et al. ............. 327/536 |
| 7,061,327 | B2 | 6/2006 | Doy |
| 7,061,328 | B2 | 6/2006 | Doy |
| 7,183,857 | B2 | 2/2007 | Doy et al. ............. 330/297 |
| 2002/0008584 | A1 | 1/2002 | Manjrekar et al. |
| 2002/0186490 | A1 | 12/2002 | Jiang et al. |
| 2003/0138112 | A1 | 7/2003 | Doy |
| 2005/0184807 | A1 | 8/2005 | Doy et al. ............. 330/297 |

FOREIGN PATENT DOCUMENTS

| | | |
|---|---|---|
| JP | 61079310 | 4/1986 |
| JP | 01117423 | 5/1989 |
| JP | 01280911 | 11/1989 |
| JP | 04072902 | 3/1992 |
| JP | 05226940 | 9/1993 |
| JP | 05-347519 | 12/1993 |
| JP | 06188660 | 7/1994 |
| JP | 07-184370 | 7/1995 |
| JP | 2002092802 | 3/2002 |
| JP | 2003-087061 | 3/2003 |
| JP | 2004-135016 | 4/2004 |
| WO | WO-98/42072 | 9/1998 |
| WO | WO98/42072 | 9/1998 |
| WO | WO 97/43825 | 11/2007 |

OTHER PUBLICATIONS

*80mW, Fixed-Gain, DirectDrive, Stereo Headphone Amplifier with Shutdown*, Maxim Integrated Products, pp. 1-18, Apr. 2003.
*Ground-Referenced. 85mW Stereo Headphone Amplifier*, National Semiconductor, pp. 1-16, Aug. 2004.
*Ground-Referenced, Ultra Low Noise, Fixed Gain, 80mW Stereo Headphone Amplifier*, National Semiconductor, pp. 1-22, Jun. 2005.
*80-mW Cap-Free Stereo Headphone Driver*, Texas Instruments Inc., pp. 1-22, Aug. 2004, revised Aug. 2005.
*80-mW Cap-Free Stereo Headphone Driver*, Texas Instruments Inc., Addendum pp. 1-4, Aug. 25, 2005.
"Dual µPower JFET-Input Operational Amplifier with Switched-Capacitor Voltage Converter", Texas Instruments Inc., pp. 1-38, (1994).
"Dual µPower JFET-Input Operational Amplifier with Switched-Capacitor Voltage Converter", Texas Instruments Inc., Addendum-p. 1-2, (Mar. 30, 2005).
Electronic Circuit Overview (textbook), Authored by Sun-Kim Huang and published May 1980 pp. 174-175 (No English translation available).
Electronic Circuit Overview (textbook), Authored by Sun-Kim Huang and published May 1980, pp. 174 and 175 (No English translation available).
Fujimoto & Partners, Foreign Office Action dated Aug. 4, 2009, Group No. 4 Chinese Patent Application No. 2007-505288, Applicant: Maxim Integrated Products, Inc.

\* cited by examiner

SINGLE SUPPLY DIRECT DRIVE AMPLIFIER

CROSS-REFERENCE TO RELATED APPLICATIONS

The present application is a continuation of U.S. patent application Ser. No. 11/711,480, filed Feb. 26, 2007, entitled SINGLE SUPPLY DIRECT DRIVE AMPLIFIER, which is a continuation of U.S. Pat. No. 7,183,857, issued Feb. 27, 2007, entitled SINGLE SUPPLY DIRECT DRIVE AMPLIFIER, which claims priority to U.S. Provisional Patent Application No. 60/592,868, filed Jul. 29, 2004, entitled SINGLE SUPPLY DIRECT DRIVE AMPLIFIER which is a continuation-in-part of U.S. Pat. No. 7,061,327 issued Jun. 13, 2006, filed Jan. 2, 2002, entitled SINGLE SUPPLY HEADPHONE DRIVER/CHARGE PUMP COMBINATION, all of which are incorporated herein by reference.

FIELD OF THE INVENTION

This invention relates generally to amplifier circuits and more particularly to single supply direct drive amplifier circuits.

BACKGROUND OF THE INVENTION

Direct drive amplifiers are used in a variety of applications. These include a host of applications where miniaturization is important, such as video and audio applications. The following background discussion focuses on prior art related to headphones, but the limitations described below are common to all prior art direct drive amplifiers. In particular, prior art direct drive amplifiers that operate from a single power supply require series output capacitors or other costly and space inefficient schemes.

PRIOR ART FIG. 1A illustrates a typical headphone connectivity diagram 8. The right headphone lead 12 and the left headphone lead 14 couple to the right and left headphone speakers respectively represented here by a headphone load 10 to the rest of the system. Each headphone load 10 as well as the overall system is connected to a common ground 16.

PRIOR ART FIG. 1B illustrates a prior art stereo headphones system 11 using a 3-way "jack socket" design for connecting a pair of headphones to a stereo system. As shown in FIG. 1B, the 3-way jack-socket design 11 is made of three electrically isolated portions 22, 26, and 28, dividers 24 and 29, and a body 23. The design of the 3-way jack socket allows for the use of a single jack socket 11 to connect a pair of headphones via the leads 12 and 14 and the common ground lead 16. As illustrated herein PRIOR ART FIG. 1A, the 3-way jack-socket system 11 includes the tip 22, which couples the left headphone speaker to the stereo system via the lead 12. Similarly, the middle portion 28 of the jack socket 23 couples the right headphone speaker to the stereo system via the lead 14. A rear portion 26 of the jack socket 23 connects the common return for the left and the right headphones to a common ground 16 that may be connected to the stereo system chassis to form a common ground. Dividers 24 and 29 electrically isolate from each other, the various electrically charged portions 22, 26 and 28 of the 3-way jack-socket.

Each headphone may be represented by a resistive headphone load to be driven by the incoming signals. Typical value for the resistive load of a headphone speaker is in 16 to 32Ω (ohm) range.

PRIOR ART FIG. 2 illustrates a typical headphone driver amplifier circuit 30. The headphone driver amplifier circuit 30 includes a pair of headphone amplifiers 32 and 34, a pair of DC coupling capacitors 40 and 42, and a pair of outputs leads 12 and 14 connecting the headphone amplifiers to the headphone speakers represented by the headphone load 10.

As shown in PRIOR ART FIG. 2, the incoming (driving) signals are amplified before reaching each headphone. In the cases where the headphones are used with portable electronic devices such as portable cassette players or portable CD players, a single positive power supply such as a battery is the only source of power. In a typical portable device, headphone driver amplifiers are from a single supply (e.g. a 5 volts or 3.3 volts battery). In order to accurately reflect the incoming signals amplified by the headphone amplifiers 32 and 34, the outputs of the headphone amplifiers 32 and 34 are biased at mid-rail ($V_{DD}/2$) allowing for the generation of both positive and negative going signals without clipping. As a result, the output of the amplifiers 32 and 34 are at a higher DC voltage with respect to ground.

In order to prevent high currents from flowing through the headphones and having the headphones in a continuously on state, direct current (DC) coupling capacitors such as 40 and 42 are inserted in series with the output of the amplifiers 32 and 34, in order to prevent a DC current from reaching the headphones. The DC coupling capacitors 40 and 42 act as a high pass filter preventing DC and very low frequency signals from reaching the headphones. In order to reproduce low frequency input signals into the 16-32Ω (ohm) load of a typical headphone, the value of these DC coupling capacitors needs to be in the 100-470 µF (micro Farad) range. However, the physical size of a 100-470 µF capacitor is prohibitively large and prevents miniaturization of the headphone circuitry. The physical size and cost of these DC blocking capacitors 40 and 42 is of a greater importance in the design of portable equipment and therefore implementing an amplifier topology that either completely eliminates the DC blocking capacitors or reduces their value and size is desirable.

Returning to PRIOR ART FIG. 2, the incoming signal I is input to the two power amplifiers 32 and 34. In order to generate positive and negative going incoming signals without signal clipping, the amplifiers 32 and 34 are typically biased at mid-rail ($V_{DD}/2$), and thus the positive and negative power supply terminals of the two amplifiers 32 and 34 are connected to the positive power supply VDD and ground (VSS) respectively. As a result, the outputs 36 and 38 of the input amplifier 32 and 34 need to be coupled to the left and right headphones through DC blocking capacitors 40 and 42 respectively. As previously discussed, in order to reproduce low frequencies into the typical 16 to 32 ohm headphones, the size of the DC blocking capacitors has to be in 100 to 470 µF range. The physical dimensions for these internal capacitors is very large and the size prevents the much desired miniaturization of the headphone driver amplifier circuit 30.

PRIOR ART FIG. 3 illustrates one prior art solution eliminating the need for DC coupling capacitors. A prior art driver amplifier circuit 43 includes a pair of headphone amplifiers 32 and 34 directly coupled to a headphone load 10 through a pair of leads 36 and 38, and a third amplifier 44 connected to the headphone load 10 via the lead 16. The headphone load 10 (representing the headphones) is biased between ground (GND) and the supply voltage VDD. With both headphone amplifiers biased to approximately the same DC value, very little DC current flows through the headphones, and the third amplifier sinks or sources current as necessary. Although the circuit depicted in PRIOR ART FIG. 3 eliminates the need for large DC coupling capacitors, this system has the disadvantage of having a common return 16 that must now be isolated from the equipment chassis since it has a DC voltage on it. This isolation introduces additional problems such as possible circuit damage if the electrical isolation of the common return from the rest of the system fails.

Therefore, it is desirable to provide a direct drive amplifier system that operates from a single voltage supply, and which does not require the usual large DC coupling capacitors or need the physical isolation of the common return of the amplifier.

BRIEF DESCRIPTION OF THE DRAWINGS

PRIOR ART

PRIOR ART

PRIOR ART

PRIOR ART

DETAILED DESCRIPTION OF THE PREFERRED EMBODIMENTS

Prior art amplifier driver systems for video and audio devices that operate from a single power supply require biasing the output at mid-range of the power supply in order to fully represent the incoming signal without the danger of any clipping. As a result, these prior art systems require that DC blocking capacitors be used in series with the amplifiers driving the output. The value and physical size of these DC coupling capacitors are prohibitively large and limit miniaturization, which is highly desired in most systems.

One aspect of the present invention allows for driver amplifier circuits that operate from a single voltage supply, without requiring the usual series coupling capacitors necessary for preventing DC current from reaching the output. An on-board power supply generates a negative voltage rail, which powers the output amplifiers, allowing driver amplifier operation from both positive and negative rails. In this way, the amplifier can be biased at ground (0 volts) potential, generating no significant DC voltage across the output load (speakers, video device, etc.).

Figure 3:
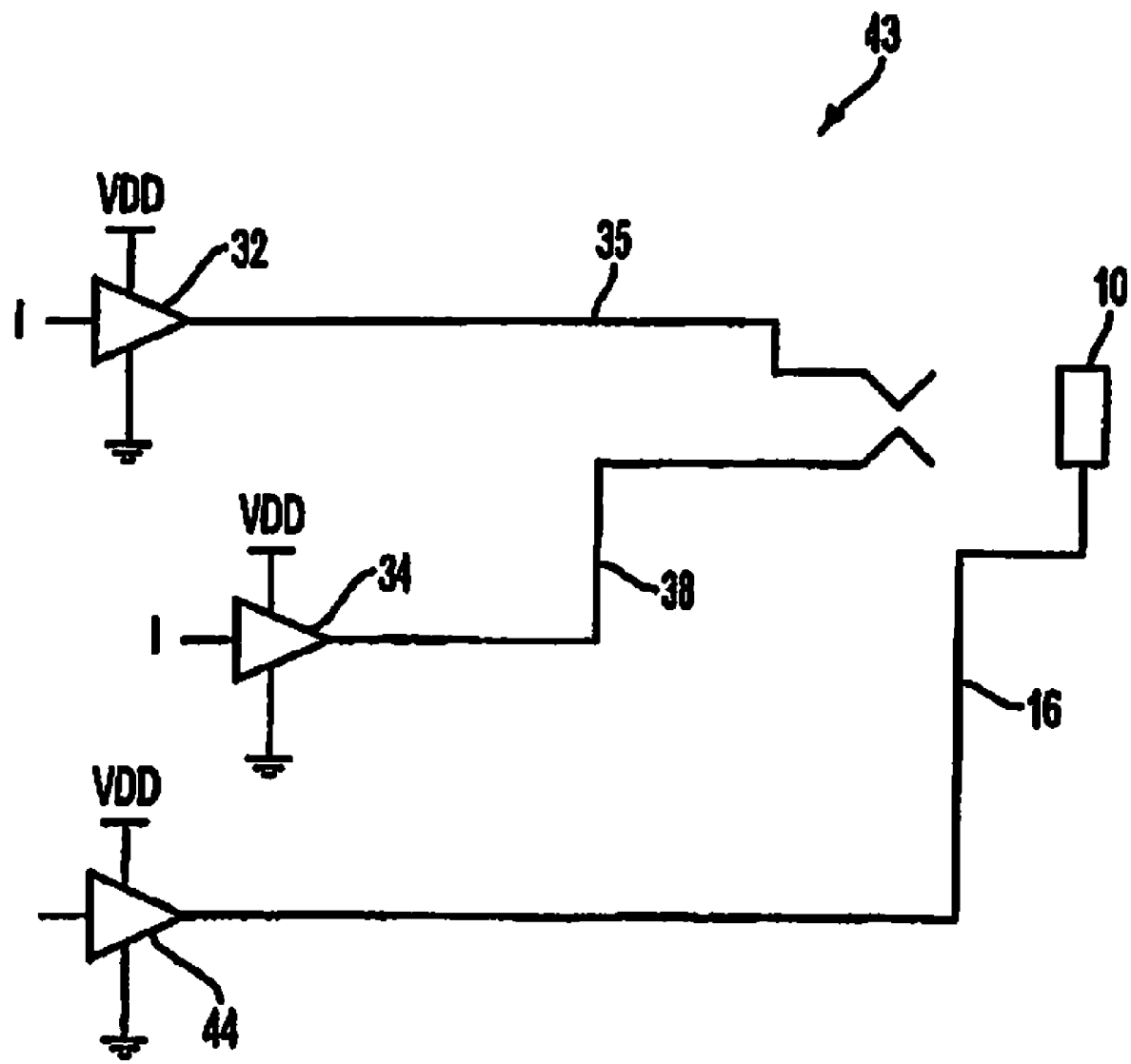
FIG. 3 illustrates one prior art solution eliminating the need for DC coupling capacitors.
Figure 4:
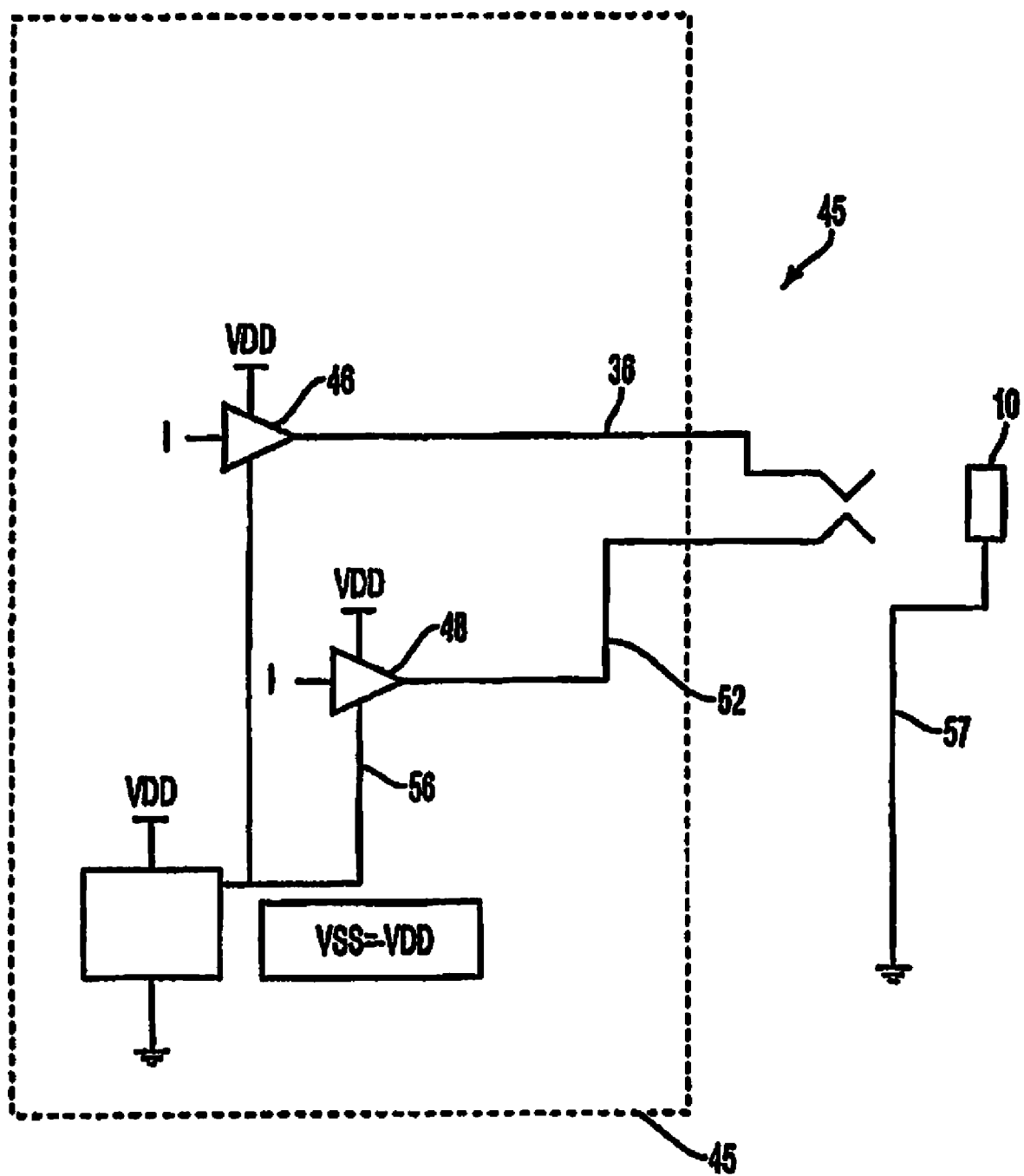
FIG. 4 illustrates a headphone amplifier circuit according to the present invention.

FIG. 4 illustrates a headphone amplifier circuit 45 according to the present invention. The headphone amplifier circuit 45 includes a first amplifier 46 driving the left headphone, a second amplifier 48 driving the right headphone, each amplifier coupled to its respective headphone load 10 via a connecting lead 50 and 52 respectively, and a charge pump 54. The headphones represented by the headphone load 10 are connected to a common ground 57. As shown in FIG. 4, instead of a third amplifier 44 shown in PRIOR ART FIG. 3 a charge pump circuitry 54 is used.

The term "charge pump" refers to a type of DC voltage-to-voltage converter that uses capacitors, and in an alternative embodiment inductors, to store and transfer energy. One type of charge pump (also referred to as switched-capacitor converters) includes a switch/diode network that charges and discharges one or more capacitors. Alternatively, in implementing the present invention, a DC voltage-to-voltage converter may be used that includes an inductor.

Figure 1A:
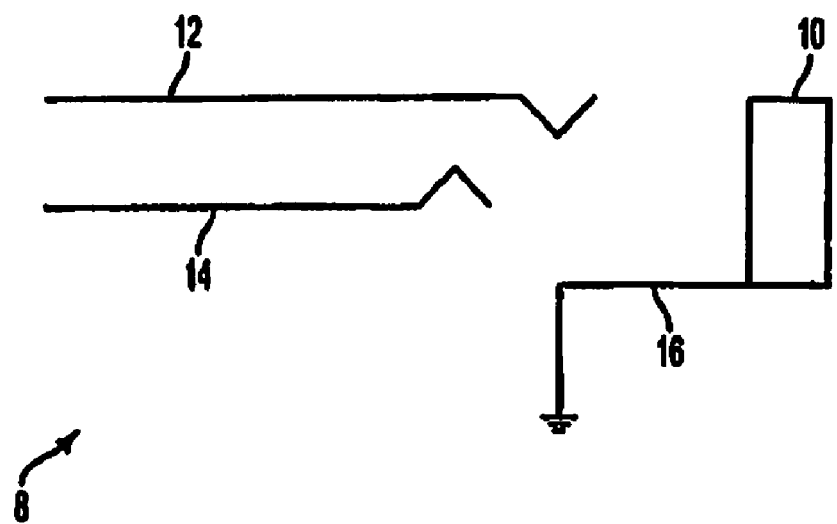
FIG. 1A illustrates a typical headphone connectivity diagram.
Figure 1B:
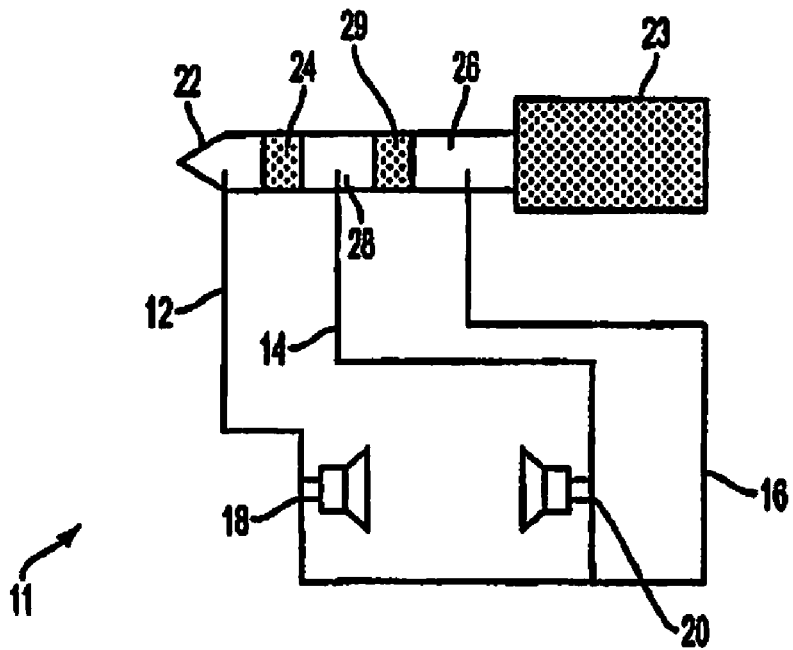
FIG. 1B illustrates a prior art stereo headphones design 11 using a 3-way "jack socket" design for connecting a pair of headphones to a stereo system.
Figure 2:
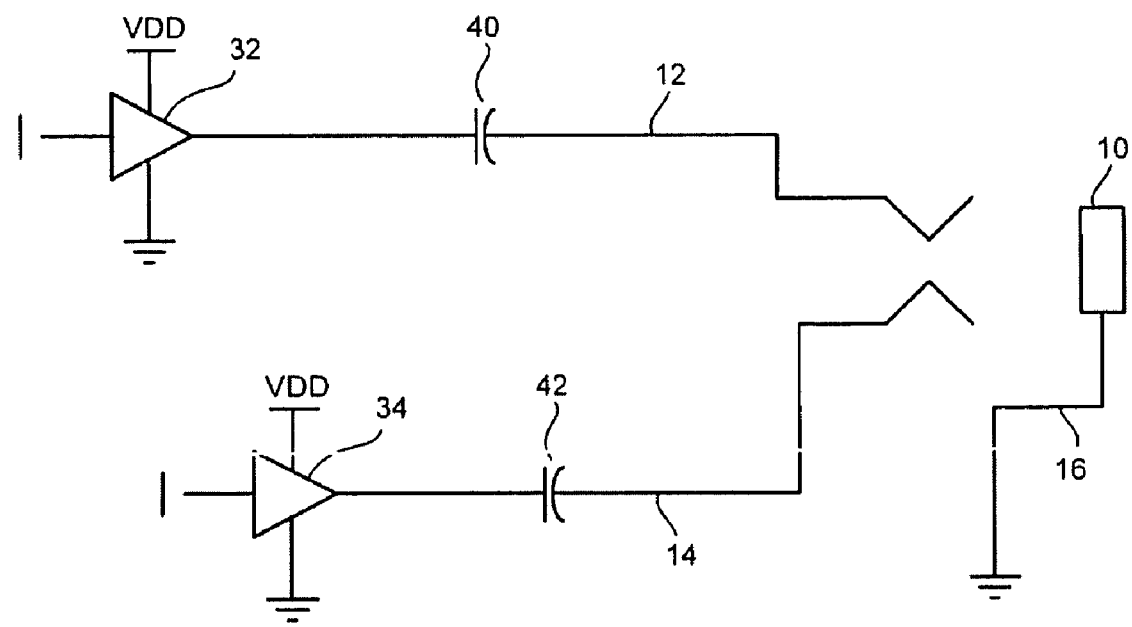
FIG. 2 illustrates a typical prior art headphone driver amplifier circuit.

The charge pump circuitry of the present invention generates a negative voltage rail −VDD with respect to ground, powering the output amplifiers and allowing driver amplifier operation from both positive and negative rails. Providing a negative voltage rail with respect to ground allows for the headphone amplifiers to be biased at ground voltage, allowing for the incoming signals to be amplified without clipping. As shown in FIG. 4, the two headphone amplifiers 46 and 48 have their positive power terminal connected to VDD, the positive voltage supply, and VSS, which is approximately equal to the negative value of VDD with respect to ground. This arrangement allows for the output terminal of both amplifiers 46 and 48 to be biased to ground, resulting in no significant DC voltage across the headphones and allowing the elimination of the large DC coupling capacitors 40 and 42 as shown in PRIOR ART FIG. 2.

Returning to FIG. 4, each of the headphone amplifiers 46 and 48 has one lead of its supply voltage terminal connected to the positive voltage rail VDD and another lead of its supply voltage terminal connected to the output 56 of the charge pump circuitry 54 supplying a negative voltage VSS equal to −VDD.

The headphone amplifier circuit 45 allows for the headphone 10 to be biased at zero volts, operating between VDD and −VDD which in turn allows for the leads 50 and 52 of the respective headphone amplifiers 46 and 48 to directly couple the headphone speakers 10 to the headphone amplifiers 46 and 48 without the need for any DC coupling capacitors in series.

Figure 5:
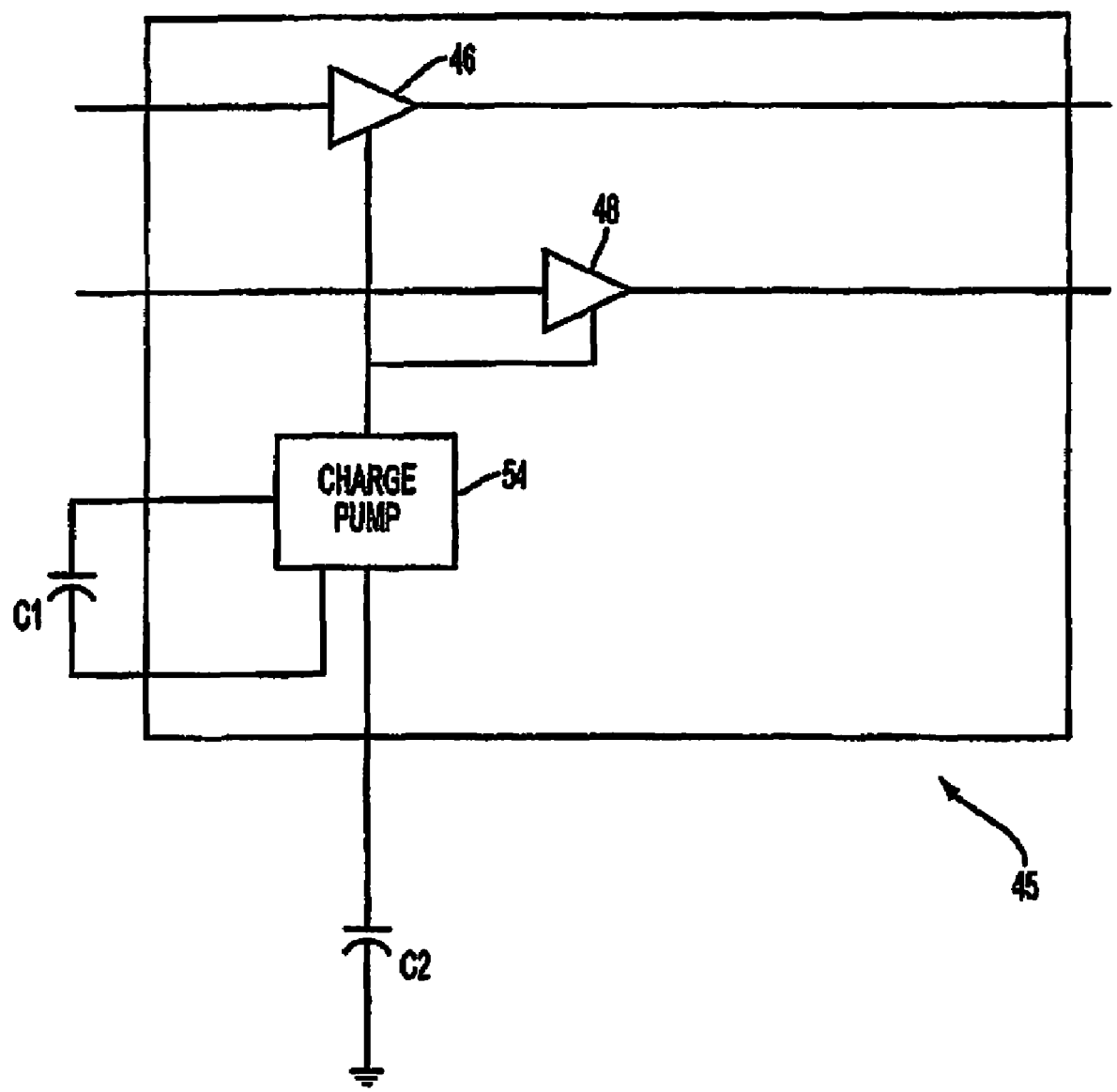
FIG. 5 illustrates one embodiment of the headphone amplifier system of the present invention in a circuit.

FIG. 5 illustrates one embodiment of the headphone amplifier system of the present invention in a circuit. The headphone amplifier system 45 includes a left headphone amplifier 46, a right headphone amplifier 48, a charge pump 54, and external capacitors C1 and C2. As shown in FIG. 5, in one embodiment of the present invention, the charge pump circuitry 54 and the power amplifiers 46 and 48 are implemented on a single integrated circuit (IC) chip 45. In this example, the charge pump 54 operation requires two small external capacitors C1 and C2. C1 is a called a "flying capacitor" and C2 is a "reservoir capacitor". The size of these two external capacitors are in the single digit micro Farad (µF) range as compared to the DC coupling capacitors of the prior art which are in the several hundred µF range.

Figure 6:
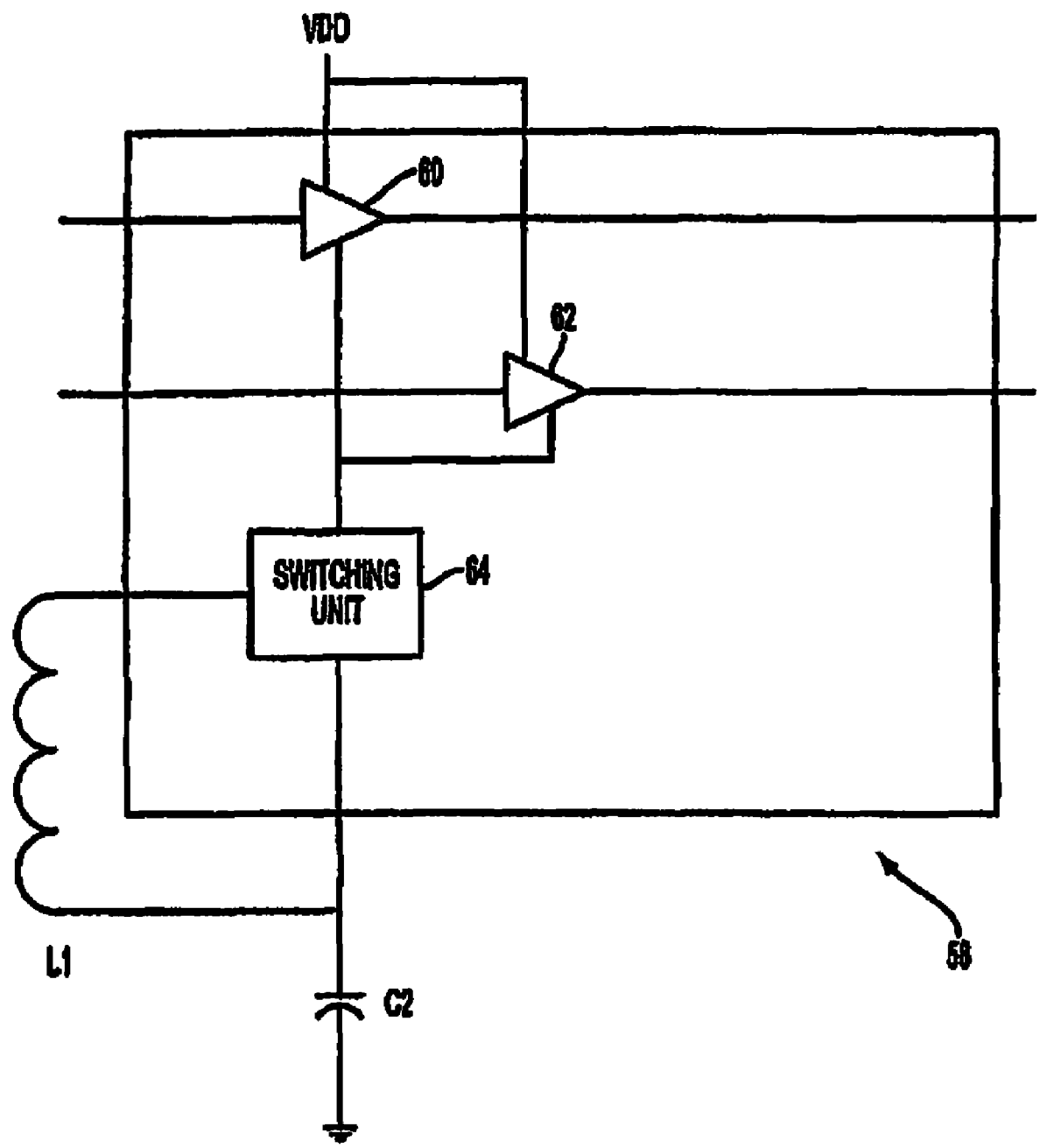
FIG. 6 is an illustration of an alternative embodiment of a headphone amplifier system according to the present invention.

FIG. 6 is an illustration of an alternative embodiment of a headphone amplifier system according to the present invention. As shown in FIG. 6, the headphone driver circuit 58 includes a first amplifier 60, a second amplifier 62, a switching unit 64, an external inductor L1 and an external capacitor C2. The inventive teachings of the present invention may further be implemented using an inductor based DC voltage-to-voltage converter. In one embodiment, the headphone driver circuit 58 may be implemented using discrete circuit components. In an alternative embodiment, an onboard inductor $L_1$ may be used in conjunction with an integrated circuit that includes an integrated switching system as well as power amplifiers for driving the headphones. In this embodiment, an external inductor L1 is used in conjunction with an external capacitor $C_1$ to convert a positive power supply voltage to a substantially equal but negative voltage supply. A switching unit 64 configures the circuit for each charge and discharge cycle. The headphone amplifiers 60 and 62 may be directly coupled to and drive their respective headphones without the need for DC coupling capacitors since the headphones are biased to ground and operate between VDD and −VDD, allowing for a complete incoming signal representation without any clipping.

Figure 7:
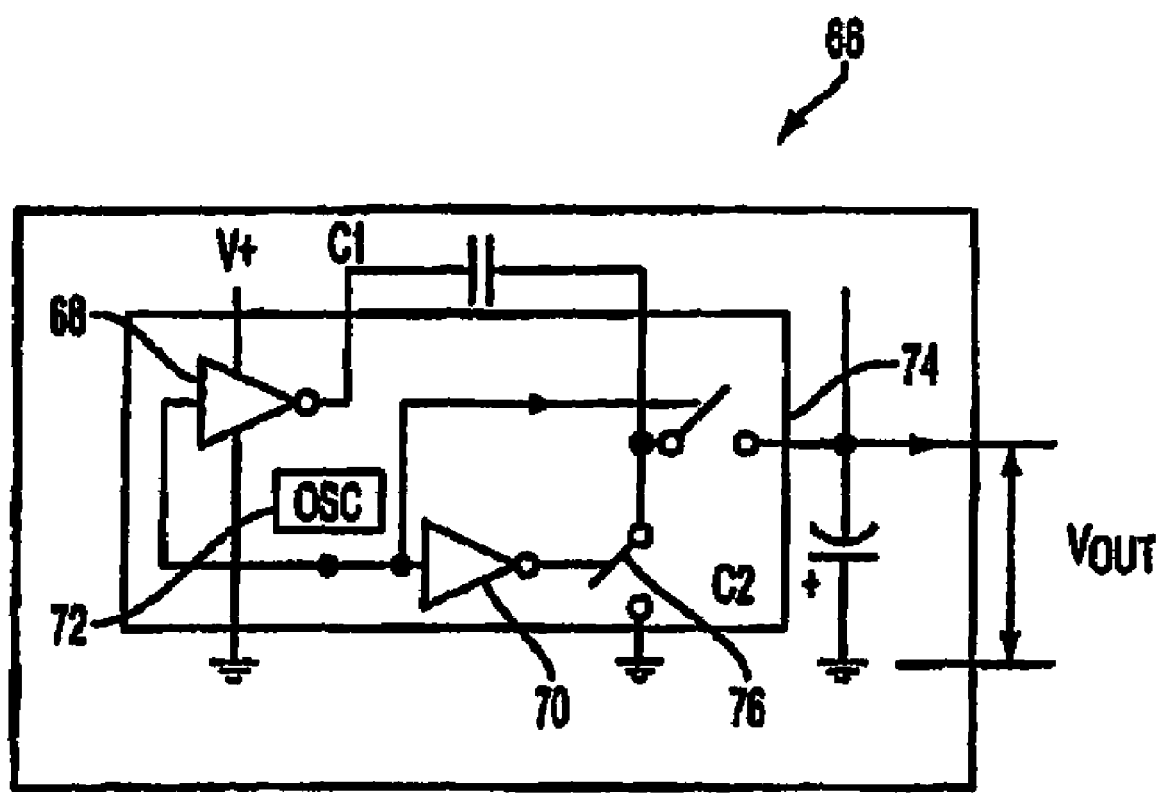
FIG. 7 illustrates a simple capacitor based, IC charge pump circuitry.

FIG. 7 is illustrates a simple capacitor-based, IC charge pump circuitry 66. The simple capacitor based IC charge pump circuitry 66 includes a pair of amplifier/inverters 68 and 70, an oscillator 72, a pair of switches 74 and 76, and a pair of external capacitors C1 and C2.

In the simple capacitor based IC charge pump circuitry 66, the switch network 74 and 76 toggles between charge and discharge states. An oscillator (OSC) 72 controls the two switches (74 and 76) that alternately charge a flying capacitor (CI) from an input voltage supplied by the amplifier 68 and 70, and discharge the flying capacitor (C1) into an output capacitor (C2). The voltage thus produced across the output capacitor C2 may be output as the output voltage (VOUT). Typically, the oscillator 72, the switches 74 and 76, and still other controls are all commonly contained in a single integrated circuit (IC).

The simple capacitor based IC charge pump circuitry 66 is of the inverting type, and it operates by lowering the potential of the charge in the flying capacitor C1 below ground, and then discharging the output capacitor C2 with this. The optimal result of this is an output voltage VOUT that is the negative of the input voltage.

One very common type of inverting charge pump operates in this way, but further includes an appreciable resistance in the charge path to the flying capacitor. The resistance intentionally introduces a delay in the charging of the flying capacitor, and appropriate control of the oscillator is then used to switch the charge before it is able to reach the full input voltage potential. This type of charge pump may accordingly transfer charge quanta having only one-half, two-thirds, etc. of the input voltage, and thereby produce an output voltage which is correspondingly lower than the input voltage. This type of step-down charge pump is probably overwhelmingly the most common today, but it is not the only type possible. Alternative circuit arrangements allow for the generation of an output voltage VOUT that is equal to some negative quanta of the input voltage.

Figure 8:
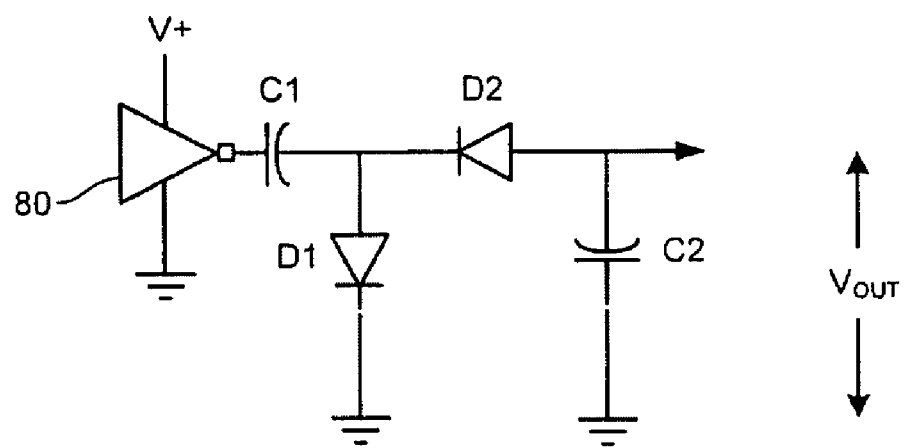
FIG. 8 illustrates a simple capacitor based discrete charge pump circuitry.

FIG. 8 illustrates a simple capacitor based discrete charge pump circuitry. The simple capacitor based discrete charge pump circuitry 78 includes an amplifier 80, a pair of capacitors C1 and C2, a pair of diodes or switches D1 and D2 and includes an input signal or external clock. In the capacitor based discrete charge pump circuit 78, the basic charge pump circuit is implemented in a discrete component circuit as shown in FIG. 8. When the output of the amplifier 80 is approximately V+, the amplifier 80 charges the flying capacitor C1 through the diode D1. When the output of amplifier 80 is approximately ground, the capacitor C1 discharges the capacitor C2 through the diode D2. A reservoir capacitor C2 holds the charge and filters the output voltage VOUT. The external clock signal along with the two diodes D1 and D2 control the cycle and direction of the charge and discharge signals.

Figure 9:
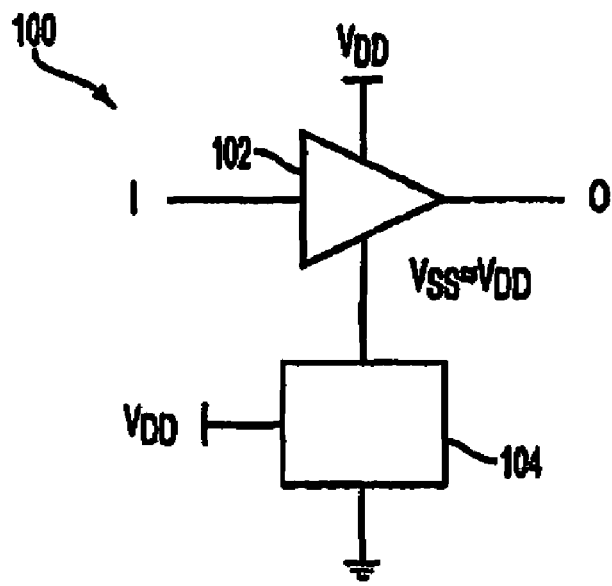
FIG. 9 illustrates a direct drive amplifier operating from a single supply and utilizing a charge pump to generate a negative rail supply.

FIG. 9 illustrates a single supply direct drive circuit 100 having a single output in accordance with one embodiment of the present invention. The circuit 100 includes an amplifier 102 and a DC-to-DC voltage converter 104. The amplifier 102 may be well suited for driving a video load, as described below with reference to FIG. 10. The voltage converter 104 may be any suitable device such as a capacitive based charge pump, an inductor based converter, etc. Such devices are described above in more detail. In contrast with the headphone examples of FIGS. 1-8, the embodiment of FIG. 9 can be used in a context where only a single output signal is necessary. In particular, a video amplifier is contemplated.

Figure 10:
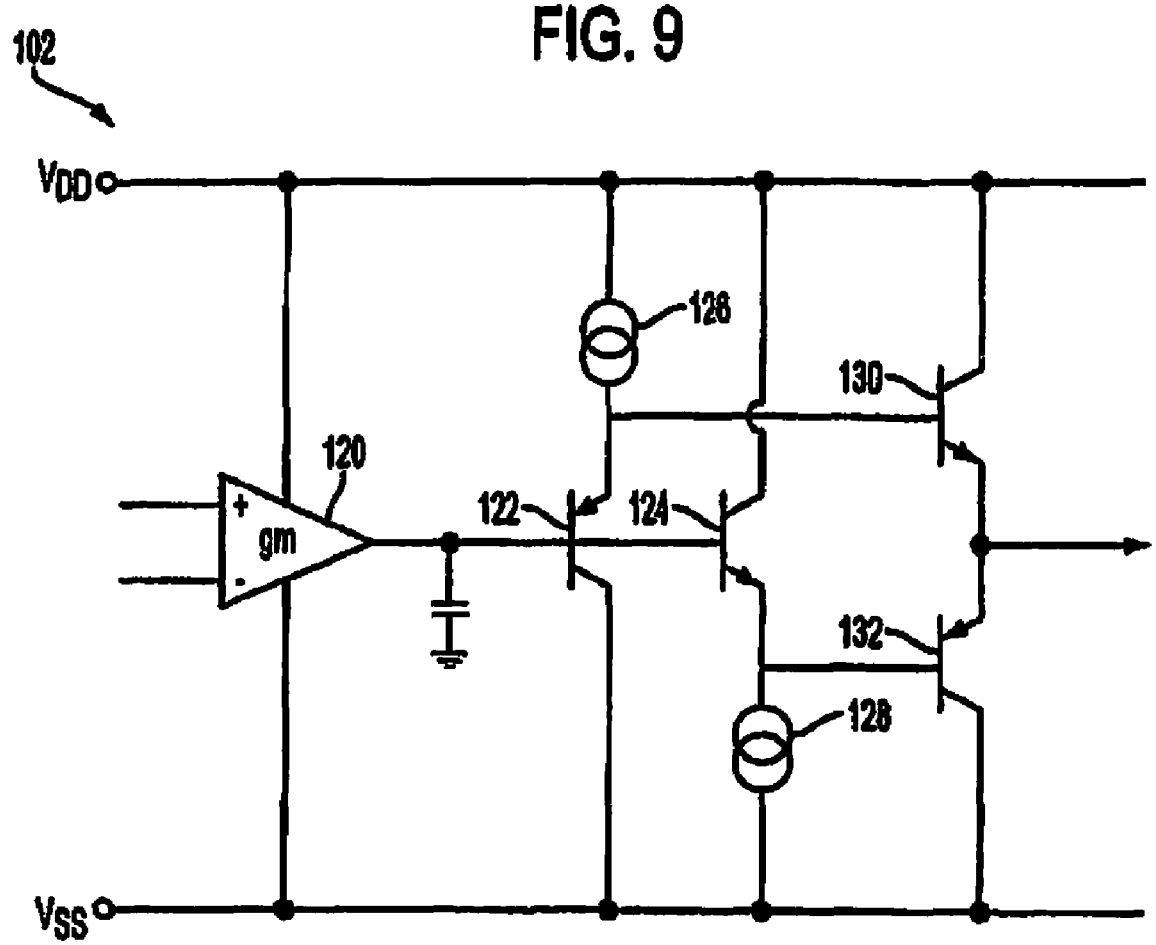
FIG. 10 illustrates a suitable architecture for a video amplifier in accordance with one embodiment of the present invention.

FIG. 10 illustrates one suitable embodiment for the amplifier 102 of FIG. 9. As will be appreciated, the architecture of FIG. 10 is straight-forward and well suited for driving a video load. The amplifier 102 includes a transconductance stage 120, first and second parallel coupled transistors 122 and 124, a current device 126 sourcing current to the first parallel coupled transistor 122, a current device 128 sinking current from the second parallel coupled transistor 124, and first and second output transistors 130 and 132. In one embodiment, the transconductance stage includes a degenerated differential pair of transistors.

Figure 11:
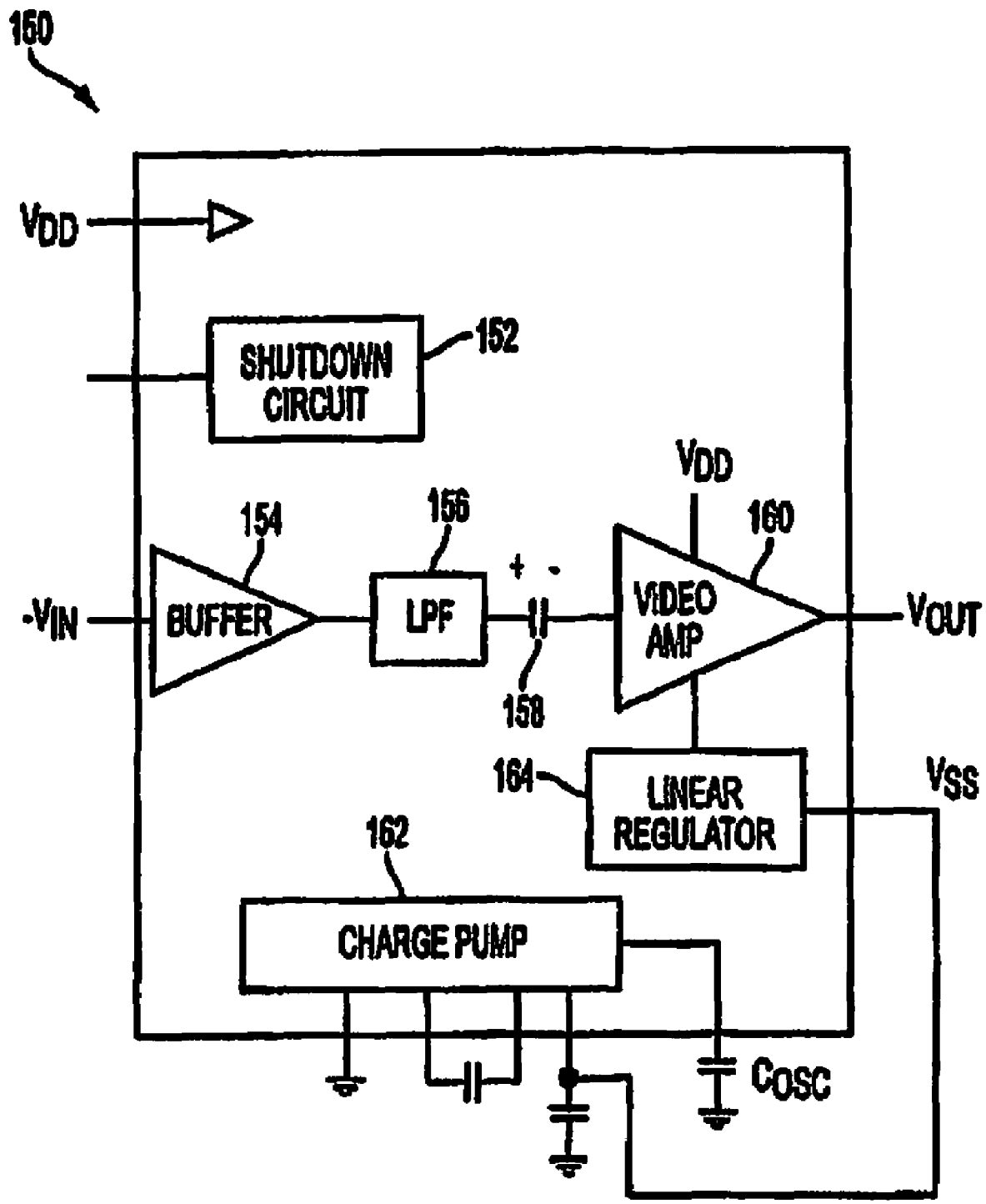
FIG. 11 illustrates an operating diagram for a single supply direct drive video amplifier of the present invention implemented on an integrated circuit.

FIG. 11 illustrates an operating diagram of a single supply direct drive video circuit in accordance with one embodiment of the present invention as an integrated circuit package 150. Although certain connections are not shown, those skilled in the art will readily understand operation of the video circuit from the diagram. The IC 150 includes a shutdown circuit, a buffer amplifier 154, a low pass or reconstruction filter 156, a DC level shift capacitor 158, a video amplifier 160, a charge pump 162, and a linear regulator 164. The low pass filter 156 should provide the desired filter response for the application, and may be a 3-pole or 4-pole filter. The video amplifier 160 and the charge pump 162 can take any suitable form such as those described earlier. The charge pump 16 or other negative voltage supply generator may create a "noisy" negative voltage supply. Accordingly, the linear regulator 164 is an optional component that can be included to provide the video amplifier with a quiet negative voltage supply. The IC 150 provides a single supply video amplifier without the need for the bulky, expensive external capacitors of the prior art.

The foregoing examples illustrate certain exemplary embodiments of the invention from which other embodiments, variations, and modifications will be apparent to those skilled in the art. As will be further appreciated, the circuit of the present invention is well suited for use in portable applications such as cellular telephones, digital cameras, portable computers, etc. The invention should therefore not be limited to the particular embodiments discussed above, but rather is defined by the following claims.

We claim:

1. A charge pump enabled stereo headphone system comprising the following formed on a single integrated circuit:

a positive power supply with respect to ground originating external to said single integrated circuit;

a charge pump coupled to said positive power supply and operable to provide, internal to said single integrated circuit, a negative power supply with respect to ground substantially equal in magnitude to a quanta of said positive power supply;

a first headphone amplifier powered by both said positive power supply and said negative power supply, said first headphone amplifier having a first audio input driven by a first audio signal provided external to said single integrated circuit, and a first audio output suitable for driving a stereo headphone with no output capacitor needed for DC blocking;

a second headphone amplifier powered by both said positive power supply and said negative power supply, said second headphone amplifier having a second audio input driven by a second audio signal provided external to said single integrated circuit, and a second audio output suitable for driving said stereo headphone with no output capacitor needed for DC blocking;

wherein said first and said second headphone amplifiers operate at 3.3 volts.

2. A charge pump enabled stereo headphone system comprising the following formed on a single integrated circuit:

a positive power supply with respect to ground originating external to said single integrated circuit;

a charge pump coupled to said positive power supply and operable to provide, internal to said single integrated circuit, a negative power supply with respect to ground substantially equal in magnitude to a quanta of said positive power supply;

a first headphone amplifier powered by both said positive power supply and said negative power supply, said first headphone amplifier having a first audio input driven by a first audio signal provided external to said single integrated circuit, and a first audio output suitable for driving a stereo headphone with no output capacitor needed for DC blocking;

a second headphone amplifier powered by both said positive power supply and said negative power supply, said second headphone amplifier having a second audio input driven by a second audio signal provided external to said single integrated circuit, and a second audio output suitable for driving said stereo headphone with no output capacitor needed for DC blocking;

wherein said first and said second headphone amplifiers operate at 5 volts.

3. A charge pump enabled stereo headphone system comprising the following formed on a single integrated circuit:

a positive power supply with respect to ground originating external to said single integrated circuit;

a charge pump coupled to said positive power supply and operable to provide, internal to said single integrated circuit, a negative power supply with respect to ground substantially equal in magnitude to a quanta of said positive power supply;

a first headphone amplifier powered by both said positive power supply and said negative power supply, said first headphone amplifier having a first audio input driven by a first audio signal provided external to said single integrated circuit, and a first audio output suitable for driving a stereo headphone with no output capacitor needed for DC blocking;

a second headphone amplifier powered by both said positive power supply and said negative power supply, said second headphone amplifier having a second audio input driven by a second audio signal provided external to said single integrated circuit, and a second audio output suitable for driving said stereo headphone with no output capacitor needed for DC blocking; and a flying capacitor with both leads coupled to said charge pump, wherein the size of said flying capacitor is in single digit micro Farad ($\mu$F) range.

4. The charge pump enabled stereo headphone system as recited in claim 3, wherein said flying capacitor is external to said integrated circuit.

5. A charge pump enabled stereo headphone system comprising the following formed on a single integrated circuit:

a positive power supply with respect to ground originating external to said single integrated circuit;

a charge pump coupled to said positive power supply and operable to provide, internal to said single integrated circuit, a negative power supply with respect to ground substantially equal in magnitude to a quanta of said positive power supply;

a first headphone amplifier powered by both said positive power supply and said negative power supply, said first headphone amplifier having a first audio input driven by a first audio signal provided external to said single integrated circuit, and a first audio output suitable for driving a stereo headphone with no output capacitor needed for DC blocking;

a second headphone amplifier powered by both said positive power supply and said negative power supply, said second headphone amplifier having a second audio input driven by a second audio signal provided external to said single integrated circuit, and a second audio output suitable for driving said stereo headphone with no output capacitor needed for DC blocking; and an output capacitor with one lead coupled to said charge pump and another lead coupled to ground, wherein the size of said output capacitor is in single digit micro Farad ($\mu$F) range.

6. The charge pump enabled stereo headphone system as recited in claim 5, wherein said output capacitor is external to said integrated circuit.

7. A monolithic integrated circuit comprising:

an input lead for a single positive power supply voltage VDD;

a first and a second headphone amplifier, the first headphone amplifier having an output operable to be coupled to a first headphone with no output capacitor for DC blocking and the second headphone amplifier having an output operable to be coupled to a second headphone with no output capacitor for DC blocking;

a charge pump circuitry with an output operable to provide a negative power supply voltage VSS, wherein the negative power supply voltage VSS is substantially equal in magnitude to a negative quanta of the positive power supply voltage VDD, said charge pump operable with a positive power supply voltage VDD; and an external flying capacitor coupled to said charge pump, wherein the size of said external flying capacitor is in single digit micro Farad ($\mu$F) range, wherein each of the first and second headphone amplifier is operable with a positive power supply voltage VDD and a negative power supply voltage VSS.

8. The monolithic integrated circuit as recited in claim 7, further comprising a shutdown circuit.

9. The monolithic integrated circuit as recited in claim 7, wherein said first and said second headphone amplifiers operate at 3.3 volts.

10. The monolithic integrated circuit as recited in claim 7, wherein said first and said second headphone amplifiers operate at 5 volts.

11. The monolithic integrated circuit as recited in claim 7, wherein said first and said second headphone amplifiers reference to ground voltage.

12. The monolithic integrated circuit as recited in claim 7, wherein said first and said second headphone amplifiers are operable to amplify a first and said second audio input signal without clipping noise.

13. The monolithic integrated circuit as recited in claim 7, wherein an external output capacitor with one lead coupled to said charge pump and another lead coupled to ground.

14. The monolithic integrated circuit as recited in claim 13, wherein size of said external output capacitor is in single digit micro Farad ($\mu$F) range.

* * * * *